United States Patent
Das et al.

(10) Patent No.: US 10,860,489 B2
(45) Date of Patent: Dec. 8, 2020

(54) BYTE SELECT CACHE COMPRESSION

(71) Applicant: Advanced Micro Devices, Inc., Santa Clara, CA (US)

(72) Inventors: Shomit N. Das, Austin, TX (US); Matthew Tomei, Champaign, IL (US); David A. Wood, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 37 days.

(21) Appl. No.: 16/176,828

(22) Filed: Oct. 31, 2018

(65) Prior Publication Data

US 2020/0133866 A1 Apr. 30, 2020

(51) Int. Cl.
*H03M 7/00* (2006.01)
*G06F 12/0871* (2016.01)
*H03M 7/30* (2006.01)
*G06F 30/00* (2020.01)

(52) U.S. Cl.
CPC .......... *G06F 12/0871* (2013.01); *G06F 30/00* (2020.01); *H03M 7/30* (2013.01); *G06F 2212/401* (2013.01)

(58) Field of Classification Search
CPC .............. G06F 12/0871; G06F 30/00; G06F 2212/401; H03M 7/30; H03M 7/00; H03M 5/00
USPC ...................................................... 341/50, 51
See application file for complete search history.

(56) References Cited

U.S. PATENT DOCUMENTS

| | | | | |
|---|---|---|---|---|
| 6,408,428 B1* | 6/2002 | Schlansker | ............. | G06F 30/30 716/104 |
| 6,477,683 B1* | 11/2002 | Killian | ...................... | G06F 8/41 716/106 |
| 8,515,882 B2* | 8/2013 | Bell, Jr. | .................. | G06N 3/126 706/13 |
| 8,924,898 B2* | 12/2014 | Killian | ...................... | G06F 8/41 716/100 |
| 2003/0208723 A1* | 11/2003 | Killian | ...................... | G06F 8/20 716/102 |
| 2004/0250231 A1* | 12/2004 | Killian | ...................... | G06F 8/41 716/102 |
| 2008/0244506 A1* | 10/2008 | Killian | ...................... | G06F 8/20 717/100 |

(Continued)

OTHER PUBLICATIONS

Arelakis, A. et al., "SC2: A Statistical Compression Cache Scheme" Proceeding of the 41st Annual International Symposium on Computer Architecture, pp. 145-156, IEEE Press, Minneapolis, MN, USA, Jun. 14-18, 2014.

(Continued)

*Primary Examiner* — Jean B Jeanglaude
(74) *Attorney, Agent, or Firm* — Volpe Koenig

(57) ABSTRACT

Techniques are disclosed for designing cache compression algorithms that control how data in caches are compressed. The techniques generate a custom "byte select algorithm" by applying repeated transforms applied to an initial compression algorithm until a set of suitability criteria is met. The suitability criteria include that the "cost" is below a threshold and that a metadata constraint is met. The "cost" is the number of blocks that can be compressed by an algorithm as compared with the "ideal" algorithm. The metadata constraint is the number of bits required for metadata.

20 Claims, 7 Drawing Sheets

(56) References Cited

U.S. PATENT DOCUMENTS

| | | | |
|---|---|---|---|
| 2012/0130928 A1* | 5/2012 | Bell, Jr. | G06N 3/126 706/13 |
| 2017/0123978 A1* | 5/2017 | Krishnamurthy | G06F 12/0802 |

OTHER PUBLICATIONS

Pekhimenko, G. et al., "Base-Delta Immediate Compression: Practical Data Compression for On-Chip Caches" Proceedings of the 21st International Conference on Parallel Architectures and Compilation Techniques, pp. 377-388, ACM, Minneapolis, Minnesota, USA, Sep. 19-23, 2012.

Alameldeen, A. et al., "Frequent Pattern Compression: A Significance-Based Compression Scheme for L2 Caches", 14 pgs., Technical Report 1500, Computer Sciences Dept., University of Wisconsin, Madison, WI, Apr. 2004.

Chen, X., et al, C-pack: A High Performance Microprocessor Cache Compression Algorithm IEEE Transactions on Very Large Scale Integration Systems, vol. 18, Issue 8, pp. 1196-1208, IEEE Educational Activities Department, Piscataway, NJ, USA, Aug. 2010.

Dusser, J. et al., "Zero-Content Augmented Caches," in Proceedings of the 23rd International Conference on Supercomputing, pp. 46-55, ACM, Yorktown Heights, New York, USA, Jun. 8-12, 2009.

Arelakis, A., et al., "HyComp: A Hybrid Cache Compression Method for Selection of Data-Type-Specific Compression Methods," in Proceedings of the 48th Annual IEEE/ACM International Symposium on Microarchitecture, pp. 38-49, ACMPress, Dec. 2015.

Sardashti, S., et al., "Decoupled Compressed Cache: Exploiting Spatial Locality for Energy-Optimized Compressed Caching," in Proceedings of 46th Annual IEEE/ACM International Symposium on Microarchitecture, pp. 91-99, IEEE, Dec. 2013.

Sardashti, S. et al., "Skewed Compressed Caches," in Proceedings of the 47th Annual IEEE/ACM International Symposium on Microarchitecture, pp. 331-342, IEEE Computer Society, 2014.

Sardashti, S. et al., "Yet Another Compressed Cache: A Low-Cost Yet Effective Compressed Cache," ACM Transactions on Architecture Code Optimization, vol. 13, Issue 3, Article 27, 26 pgs., ACM, Sep. 2016.

Panda, B. et al., "Dictionary Sharing: An Efficient Cache Compression Scheme for Compressed Caches," in Proceedings of 49th Annual IEEE/ACM International Symposium on Microarchitecture (MICRO), pp. 1-12, IEEE, Oct. 2016.

Pekhimenko, G. et al., "Toggle-Aware Compression for GPUs," IEEE Computer Architecture Letters, vol. 14, Issue 2, pp. 164-168, IEEE Computer Society, Jul. 2015.

* cited by examiner

BYTE SELECT CACHE COMPRESSION

This invention was made with Government support under PathForward Project with Lawrence Livermore National Security (Prime Contract No. DE-AC52-07NA27344, Subcontract No. B620717) awarded by DOE. The Government has certain rights in this invention.

BACKGROUND

Cache memories are sometimes compressed to reduce the amount of die area required. Cache compression algorithms are typically designed in an ad hoc manner. Improvements to cache compression are constantly being made.

BRIEF DESCRIPTION OF THE DRAWINGS

A more detailed understanding may be had from the following description, given by way of example in conjunction with the accompanying drawings wherein.

DETAILED DESCRIPTION

The disclosure herein provides techniques for designing cache compression algorithms that control how data is compressed. Note that although it is sometimes described herein that the data to be compressed is stored in a cache, it is also possible for the techniques described herein to be used to compress and decompress data for storage in other memories that are not considered caches. The techniques generate a custom "byte select algorithm" by applying repeated transforms to an initial compression algorithm until a set of suitability criteria is met. The suitability criteria include that the "cost" is below a threshold and that a metadata constraint is met. The "cost" is the number of blocks that can be compressed by an algorithm as compared with the "ideal" algorithm. The metadata constraint is the number of bits required for metadata.

The byte select algorithm is compressed as a dictionary of unique bytes combined with a set of metadata. The metadata indicates which bytes of an output block (i.e., a decompressed block) are to receive which dictionary bytes. The amount of metadata needed is based on the possibilities that can be encoded. In an "ideal" algorithm, the metadata is able to encode that any output byte is identical to any input byte. However, such an algorithm may require too much metadata due to the number of possibilities encoded by that metadata being too high. The transforms reduce the amount of metadata needed by reducing the number of possibilities that can be encoded by the metadata. The transforms include an edge removal transform and an edge coalescence transform. The edge removal transform reduces the possibilities available for storage by metadata of a byte select algorithm by removing the possibility that the metadata is able to indicate that a specific byte in an input block has an identical value to a specific byte in an output block. The edge coalescence transform reduces the possibilities available for storage by metadata of a byte select algorithm by removing the possibility that the metadata is able to independently indicate that a first byte of an input block has the same value as a first byte of an output block and that a second byte of the input block has the same value as a second byte of the output block.

Figure 1:
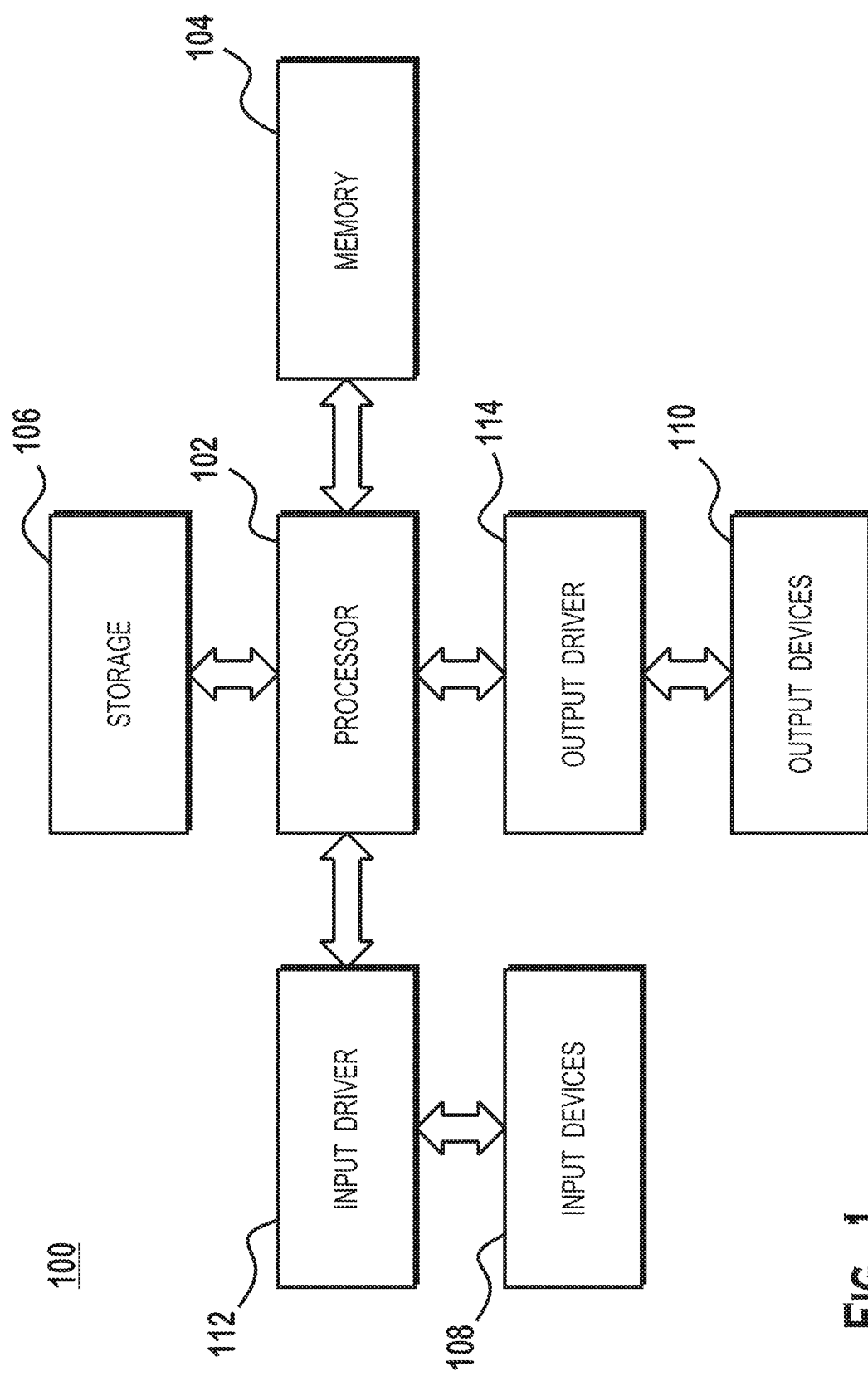
FIG. 1 is a block diagram illustrating details of a computer system, according to an example.

FIG. 1 is a block diagram illustrating details of a computer system 100 in which aspects of the present disclosure can be implemented, according to an example. The computer system 100 includes, for example, a computer, a gaming device, a handheld device, a set-top box, a television, a mobile phone, or a tablet computer. The computer system 100 includes a processor 102, a memory 104, a storage device 106, one or more input devices 108, and one or more output devices 110. The computer system 100 also includes an input driver 112 and an output driver 114. It is understood that the device 100 may include additional components not shown in FIG. 1.

The processor 102 includes a central processing unit (CPU), a graphics processing unit (GPU), a CPU and GPU located on the same die, or one or more processor cores, wherein each processor core may be a CPU or a GPU. The memory 104 is located on the same die as the processor 102, or may be located separately from the processor 102. The memory 104 includes a volatile or non-volatile memory, for example, random access memory (RAM), dynamic RAM, or a cache.

The storage device 106 includes a fixed or removable storage, for example, a hard disk drive, a solid state drive, an optical disk, or a flash drive. The input devices 108 include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. Various components within the computer system 100, such as the processor 102, storage 106, and devices in input devices 108 and output devices 110, include cache memories.

Figure 2:
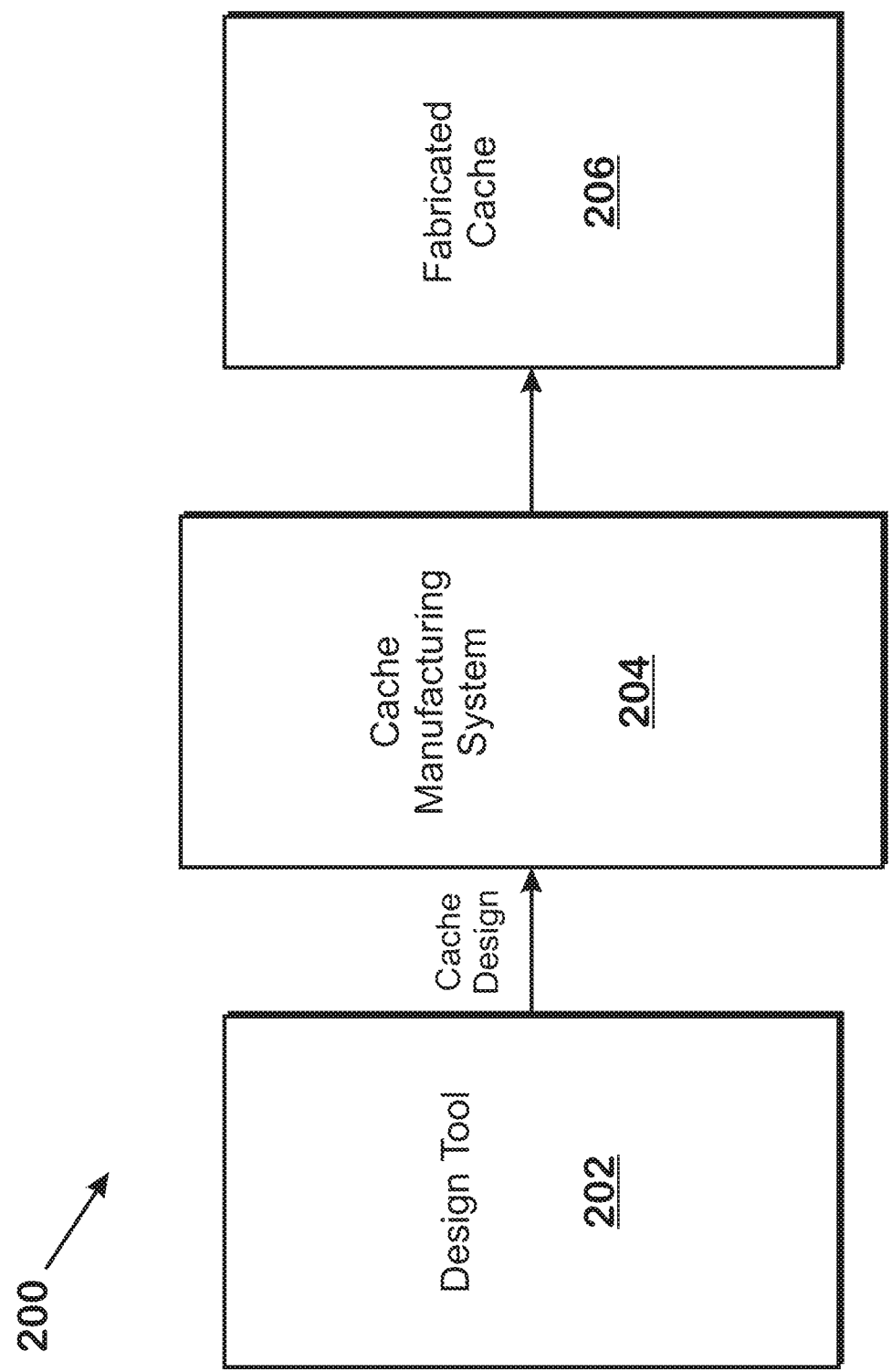
FIG. 2 is a block diagram of a cache design system, according to an example.

FIG. 2 is a block diagram of a cache design system 200, according to an example. The cache design system 200 includes a design tool 202, and a cache manufacturing system 204, and outputs a fabricated cache 206. The design tool 202 is a computing device that includes one or more modules (e.g., software applications, hardware circuitry, firmware, or the like) that generate hardware plans to manufacture at least a portion of one or more caches. In general, the design tool 202 includes at least one processor that processes instructions stored in a memory to perform the operations described herein. The plans ("cache design") are provided to a cache manufacturing system 204, which creates a fabricated cache 206 based on the plans. The design tool 202 and cache manufacturing system 204 each may include multiple components that are physically and/or logically different and that are located in the same place or at different locations.

Figure 3:
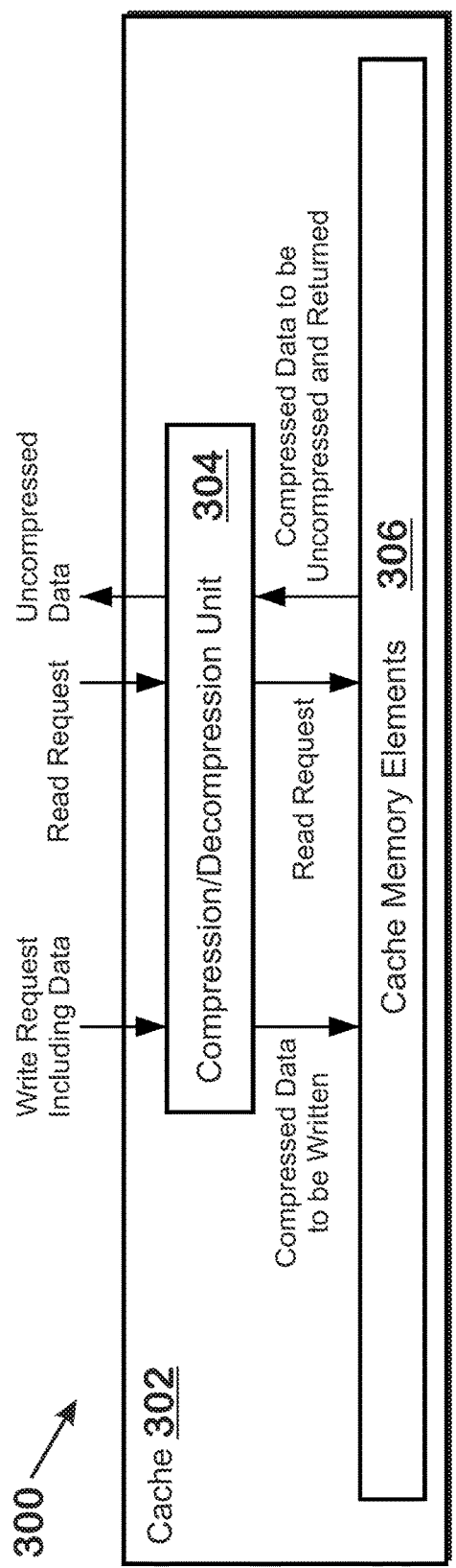
FIG. 3 is a block diagram of a cache implementing compression, according to an example.

FIG. 3 is a block diagram of a cache 302 (which may be one of the fabricated caches 206 of FIG. 2), according to an example. The cache 302 includes cache memory elements 306 that store data to be read and written to by clients of the cache 302, and a compression/decompression unit 304. The compression/decompression unit 304 compresses data for storage in the cache memory elements 306 and decompresses data for reading out of the cache memory elements 306. More specifically, in response to the cache 302 receiving a write request, which includes data, the compression/decompression unit 304 compresses the received data and stores the compressed data in the cache memory elements 306. In response to the cache 302 receiving a read request, the compression/decompression unit 304 decompresses the requested data and transmits that requested data to the entity that requested the data.

Figure 4:
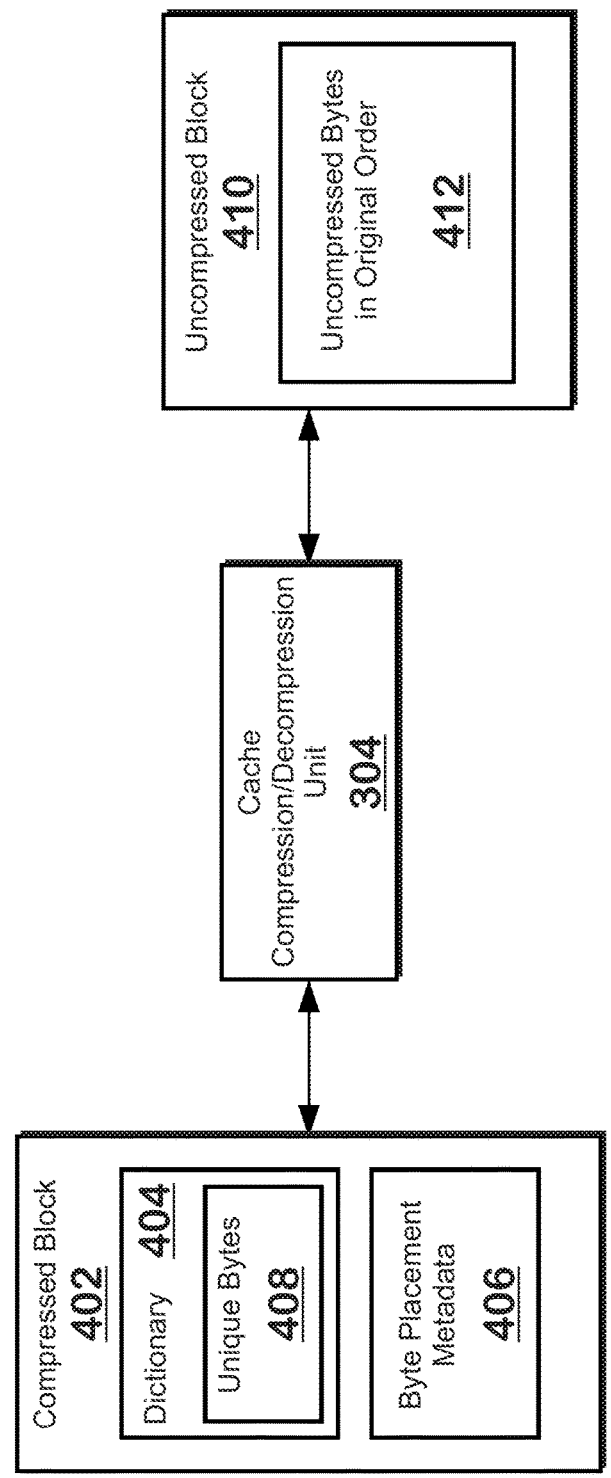
FIG. 4 illustrates details of a compressed block stored in the cache memory elements, according to an example.

FIG. 4 illustrates details of a compressed block stored in the cache memory elements, according to an example. The cache memory elements 306 store compressed blocks 402, each of which corresponds to an uncompressed block 410. The compression and decompression described elsewhere herein includes converting an uncompressed block 410 to a compressed block 402, and vice versa, respectively.

The idea behind the compression scheme illustrated in FIG. 4 is that compression schemes can be generically represented as byte-select algorithms. A byte select algorithm is one in which the compressed block 402 includes a dictionary 404 and byte placement metadata 406. The dictionary 404 stores all unique bytes in the uncompressed block 410. The byte placement metadata 406 dictates where the unique bytes 408 are located in the uncompressed block 410. It should be noted that blocks that have more unique bytes than the size of the dictionary 404 cannot be compressed. For example, if the dictionary 404 is 24 bytes and a particular uncompressed block 410 has 30 unique bytes, then that uncompressed block 410 cannot be compressed. It should also be understood that the size of the compressed block 402 is equal to the size of the dictionary 404 plus the size of the byte placement metadata 406. The algorithm is called "byte select" because, during decompression, the byte for each location in the uncompressed block 410 is determined by selecting one of the unique bytes 408 from the dictionary 404 based on the byte placement metadata 406.

A very large number of different byte select algorithms are possible. One limitation to impose on byte select algorithms is to limit the size of the dictionary 404 and the amount of byte placement metadata 406 necessary to describe how to decompress a compressed block 402. For example, the dictionary may be limited to having a maximum of 24 unique bytes, for an uncompressed block 410 of 64 bytes in size. The compressed block 402 may be limited to 32 bytes such that the byte placement metadata 406 can include only 8 bytes. Limiting the size of the dictionary 404 means that a block must have a number of unique bytes that is fewer than or equal to the size of the dictionary 404. The techniques provided herein allow for the automatic generation of particular byte select algorithms based on a set of size limitations (e.g., metadata size and dictionary size) and on a set of training data. In general, the technique starts at an "ideal" algorithm that does not meet the set of size limitations and performs a series of transforms on the ideal algorithm to reduce the amount of metadata needed by reducing the number of possibilities through which compression can occur.

Figure 5A:
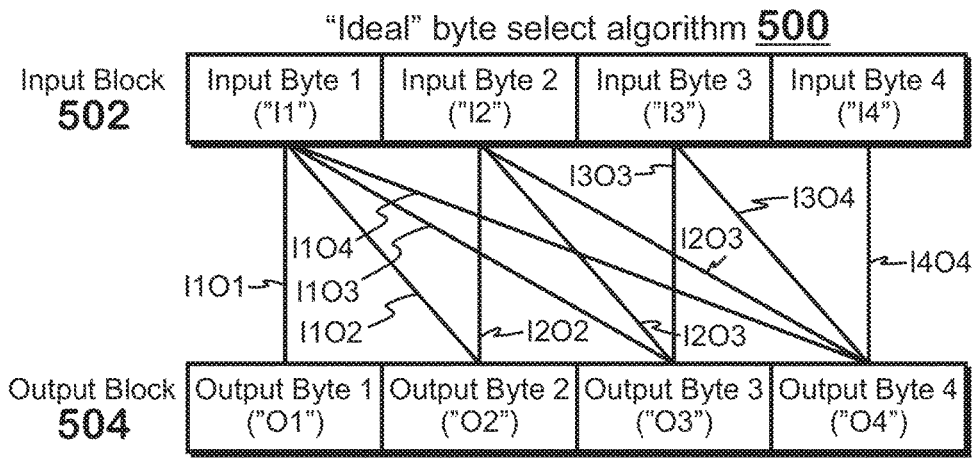
FIG. 5A illustrates an "ideal" byte select algorithm, according to an example.

FIG. 5A illustrates an "ideal" byte select algorithm, according to an example. This algorithm illustrates an input block 502 and an output block 504, as well as a series of edges therebetween. Each byte of the input block 502 has a unique label, such as "I1" (for input byte 1), "I2" (for input byte 2), etc. Similarly, each byte of the output block 504 has a label such as O1 and O2. The edges are labeled based on the input byte and output byte connected by the edge (e.g., I1O2 for the edge that is coupled between input byte 1 and output byte 2).

Each edge represents the possibility that a particular output byte has the same value as a particular input byte and thus uses the same slot in the dictionary 404. The "ideal" byte select algorithm 500 is an algorithm that has no constraints on its metadata, and thus represents the algorithm that is able to compress the most number of input blocks given a particular dictionary size. That the ideal byte select algorithm 500 has no constraints on metadata is in contrast with the two constraints placed on metadata described elsewhere herein, which include the edge removal and edge coalescence restraints. The ideal byte select algorithm 500 is thus "ideal" in the sense that a compression that is done per this algorithm can record in its metadata that any particular output byte has the same value as any particular input byte. For instance, it is possible for the metadata to denote that all output bytes share the same value as input byte 1, or that output bytes O1 and O2 share the same value as input byte I1 and that output bytes O3 and O4 share the same value as input byte I2, and so on. In sum, the edges represent the ability for the ideal algorithm to encode the fact that a particular output byte shares the same value as a particular input byte, thereby allowing compression by storing only one byte in the dictionary for multiple output bytes as well as metadata that indicates that those output bytes are supposed to have the value of that byte in the dictionary. This algorithm is "ideal" in the sense that the metadata of the algorithm is able to note that any particular output byte shares the same value as any particular input byte.

It should be understood that the values of the input block and output block are of course identical, since the compression described herein is lossless. However, they are shown separately to illustrate the origin of the byte value for each output byte in the input block. This notion of origins within the input block is what allows compression to occur. More specifically, if more than two output bytes derive their values from the same input byte, then that byte may be represented once in the compressed block, in addition to metadata indicating which output byte locations are to receive that byte value during decompression.

Figure 5B:
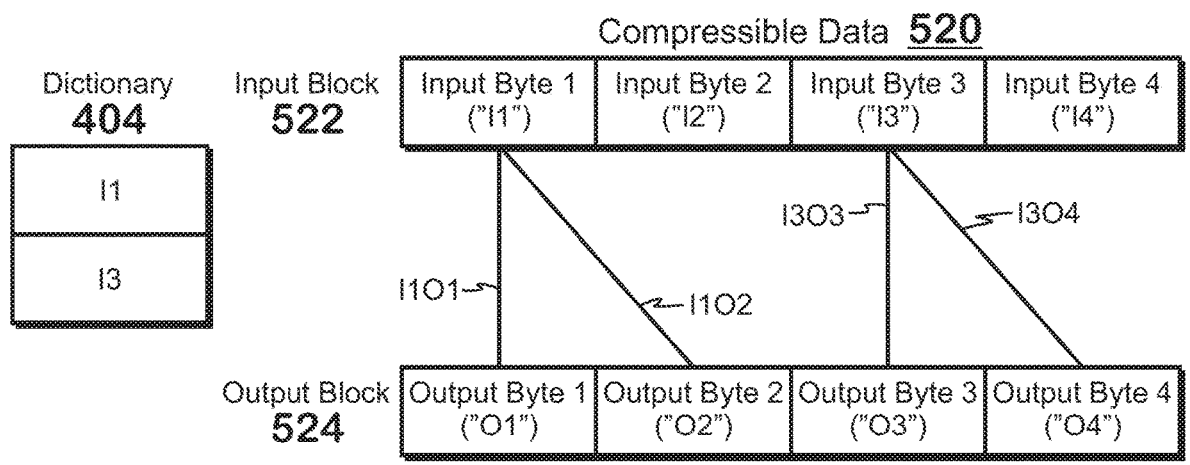
FIG. 5B illustrates a particular block of compressible data that can be compressed according to the ideal byte select algorithm, according to an example.

FIG. 5B illustrates a particular block of compressible data 520 that can be compressed according to the ideal byte select algorithm 500, according to an example. In this block, the first and second bytes are the same and the third and fourth bytes are the same. Thus, the metadata indicates that both output bytes 1 and 2 share the same value as input byte 1. In addition, the metadata indicates that both output bytes 3 and 4 share the same value as input byte 3. The compressed block thus includes the dictionary 404 of unique bytes I1 and I3 as well as the metadata indicating that the first and second bytes get dictionary byte 1 and the third and fourth bytes get dictionary byte 2. Note that the edges in FIG. 5B have a slightly different meaning than the edges in FIG. 5A. Specifically, where the edges in FIG. 5A indicate the possibilities (e.g., the possibilities that output bytes could have the same value as input bytes) that could be represented by the metadata of a specific algorithm, the edges in FIG. 5B indicate that specific output bytes have the same values as specific input bytes. Note that the data of FIG. 5B is considered to be compressible because the total number of unique bytes of the input block 522 is equal to or less than the size of the dictionary 404 (which in FIG. 5B is two bytes).

Figure 5C:
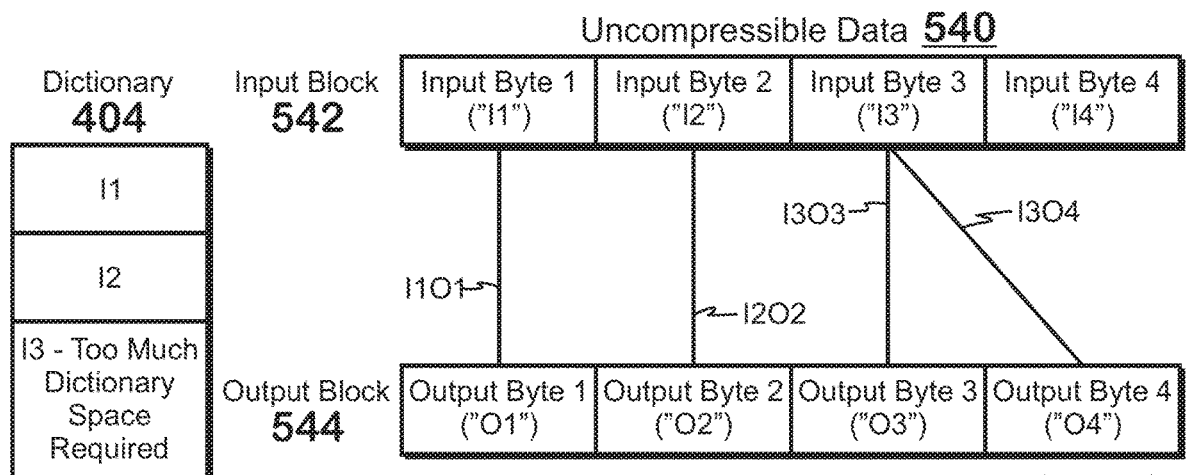
FIG. 5C illustrates a situation where the data is uncompressible due to having too many unique bytes, according to an example.

FIG. 5C illustrates a situation where the data is uncompressible (shown as uncompressible data 540) due to having too many unique bytes, according to an example. In FIG. 5C, the input block 542 has three unique bytes—I1, I2, and I3. Byte I4 has the same value as byte I3 (thus there is an edge from O4 to O3). Because there are three unique bytes and the dictionary has only size 2, the input block 542 is not compressible by the ideal algorithm.

One issue with the "ideal" byte select algorithm is that the amount of metadata required may be quite high. For example, an ideal algorithm for compressing a 64 byte block compressed using a 24 byte dictionary requires 5 bits of metadata per byte, which is 40 bytes. If the dictionary size is 24 bytes, the total amount of data for a compressed block is 64 bytes. If the desired size for a compressed block is 32 bytes, then the amount of metadata required by the "ideal" algorithm is too high.

To reduce the amount of metadata required, the cache design tool 202 iterates over transforms to the ideal algorithm until a satisfactory algorithm is found. The transforms reduce the amount of metadata needed by reducing the set of possibilities that the metadata can represent. The transforms are now described with respect to FIG. 6.

Figure 6:
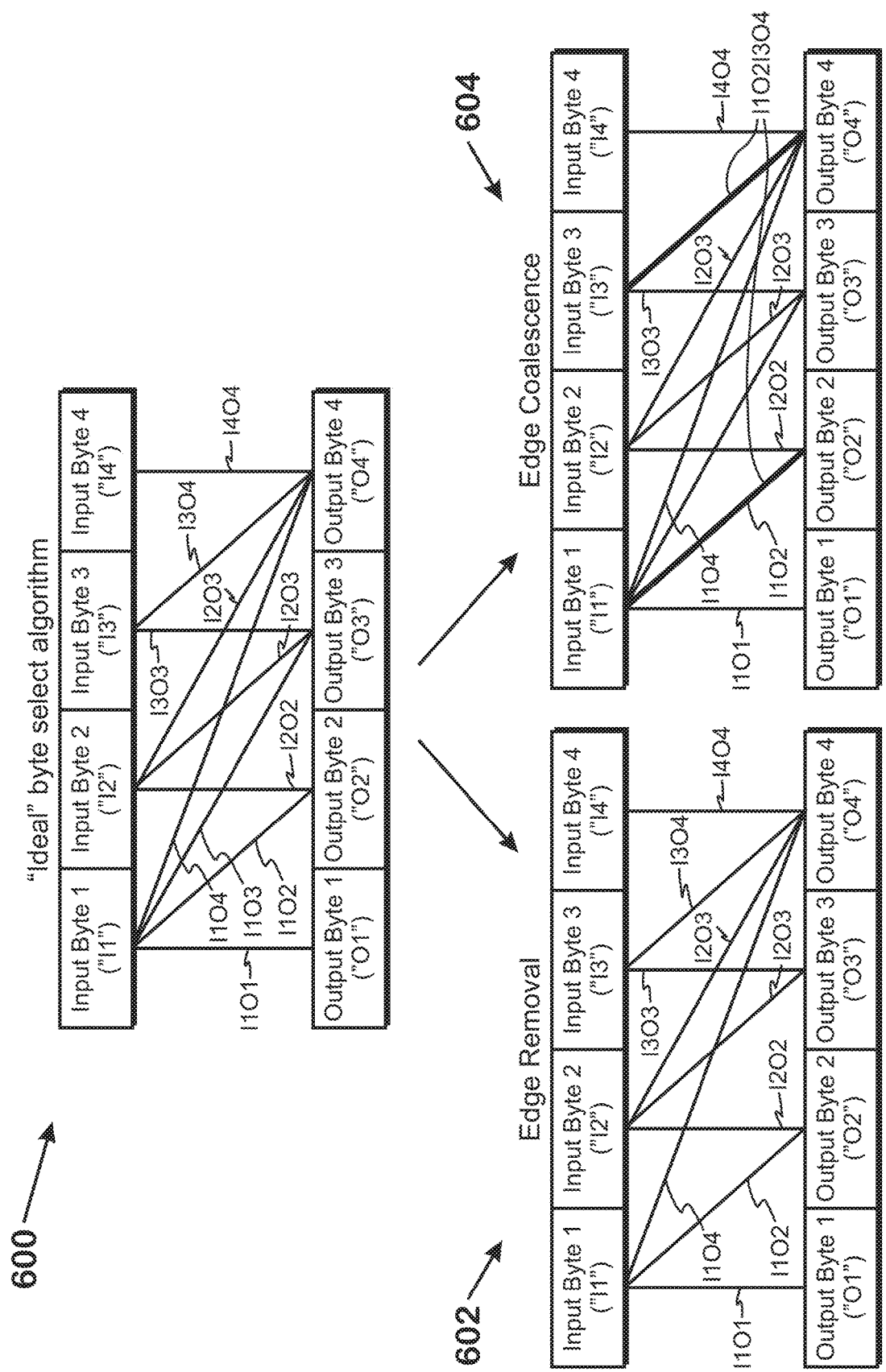
FIG. 6 illustrates two algorithm transforms for reducing the amount of metadata of an algorithm, according to an example.

FIG. 6 illustrates two algorithm transforms for reducing the amount of metadata of an algorithm, according to an example. A first transform is edge removal. Edge removal removes the ability for the metadata to represent that a particular output byte has the same value as a particular input byte. By removing this possibility, the amount of metadata required for compression is reduced. In FIG. 6, the edge that has been removed is the edge between input byte 1 and output byte 3. This means that the metadata is unable to represent that input byte 1 and output byte 3 have the same value. In the situation that input byte 1 and output byte 3 did have the same value, the dictionary would have to represent that value twice.

The edge coalescence transform 604 causes two edges to be coalesced. Coalescing an edge reduces the number of possibilities for the metadata to store by requiring that if one of the coalesced edges is used, then the other coalesced edge is also used. In other words, the encoding in the metadata that indicates that the two values pointed to by the first edge of a coalesced edge are the same also necessarily indicates that the two values pointed to by the second edge of a coalesced edge are the same as well.

The edges that are coalesced in the particular example are I1O2 and I3O4. This means that if the algorithm represented by the edges shown for the edge coalescence transform 604 determines both that I1 and O2 have the same value and that I3 and O4 have the same value, this can be represented with a particular metadata encoding. However, the algorithm could not independently use either edge. If one is used, the other is also used.

To encode a block for which the group of bytes pointed to by one edge of a coalesced edge are the same but for which the other group of bytes of the other edge of the coalesced edge are not the same, no edge of the coalesced edge can be used. Instead, different edges are used, which could result in the duplication of unique bytes in the dictionary. In an example, I1 and O2 are the same but I3 and O4 are not. In this example, I1O2I3O4 could not be used. Instead, edges like I2O2 and/or I4O4 would be used. If the block cannot be compressed using the available edges (for example because no combination of edges results in a number of unique bytes that fits in the dictionary), then the particular block would not be compressible according to the algorithm.

It should be understood that it is possible to coalesce more than two edges. In such a situation, if any of the edges in that coalesced edge is used, then all other edges must be used. In other words, if the metadata is to encode that the two bytes associated with one of the edges are the same, then that metadata also encodes that the two bytes associated with each of the other edges is the same.

It should be understood that the term "metadata" is used in two senses herein. In a first sense, referred to as a "metadata encoding," the term metadata refers to the possible input block/output block identical values that can be encoded by a particular algorithm. For example, with the ideal algorithm, the metadata can encode, for any input byte, that any output byte has the same value as that input byte. For more restricted algorithms, the metadata can encode a more limited set of identical values. This first sense of the word "metadata" may also be called a "compression algorithm" herein.

In another sense, referred to as a "metadata instance," the metadata refers to a specific set of data stored as the byte placement metadata 406 in a particular compressed block 402. In this sense, the metadata refers to the data that indicates how to expand the dictionary into the output block. In other words, the metadata in this sense indicates the positions in the decompressed cache block in which each unique byte in the dictionary 404 is to be placed. It should be understood that reducing the number of possibilities that the metadata encoding can represent also reduces the number of bits required to store the byte placement metadata 406 in a compressed block 402. The number of possibilities is reduced through the two transforms described with respect to FIG. 6.

Figure 7:
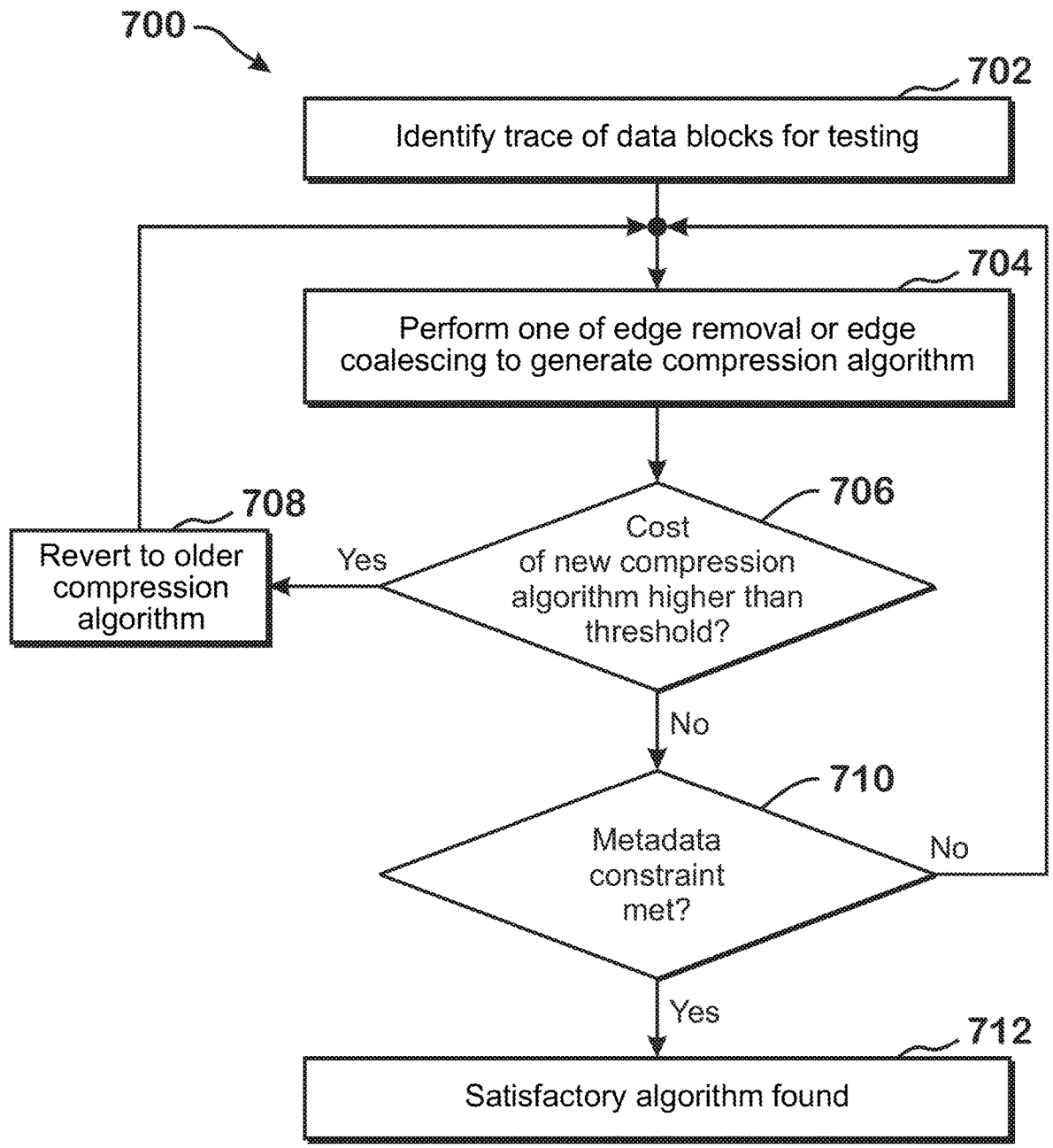
FIG. 7 is a flow diagram of a method for generating a compression algorithm based on training data, according to an example.

FIG. 7 is a flow diagram of a method 700 for generating a compression algorithm based on training data, according to an example. Although described with respect to the system of FIGS. 1-6, it should be understood that any system, configured to perform the steps of method 700 in any technically feasible order, falls within the scope of the present disclosure.

The method 700 begins at step 702, where the design tool 202 identifies a trace of data blocks for testing. A trace of data blocks is a sequence of data blocks used to train a particular compression algorithm. The trace of data blocks is intended to be a representative sample of data of the type that the cache to be manufactured is intended to store. The trace may be tailored to specific uses for special use caches (e.g., a set of instructions for an instruction cache, a set of data for a data cache, a set of texture data for a texture cache used in 3D rendering), or may be "generic" data intended to be representative of data for non-specific caches.

At step 704, the design tool 202 performs one transform on a compression algorithm to obtain a new compression algorithm. The compression algorithm that the method 700 begins with may be any compression algorithm. In one example, the compression algorithm that the method 700 begins with is the ideal algorithm for a particular combination of uncompressed block size, dictionary size, and metadata size. Step 704 results in a new compression algorithm that is one transformation different from the previous compression algorithm.

At step 706, the design tool 202 calculates the cost of the new compression algorithm and determines whether the cost is above a threshold. The "cost" is the number of blocks in the trace that cannot be compressed with the new compression algorithm. The threshold is set in any technically feasible manner. In one example, a constant, pre-determined threshold is used. In another example, the design tool 202 starts with a particular "guess" for the threshold and adjusts the threshold if no satisfactory algorithm is found. The threshold represents the highest cost that is considered to be acceptable for an algorithm. If the cost for the new compression algorithm is higher than the threshold, then the method 700 proceeds to step 708 and if the cost is not higher than the threshold, then the method 700 proceeds to step 710.

At step 708, since the cost is higher than the threshold, the design tool 202 reverts to a previous algorithm. For example, if the current new compression algorithm is generated based on a sequence of three transforms made with respect to the ideal algorithm and the cost for that algorithm is higher than the threshold, then step 708 moves back to an algorithm that existed before one of the three transforms. After step 708, the method 700 returns to step 704, in which the design tool 202 tries a transform not already tried. The technique of trying transforms, determining that one or more transforms results in a cost that is too high, and trying different transforms in a loop is described in more detail with respect to FIG. 8.

At step 710, the design tool 202 determines whether the metadata constraint is met. The metadata constraint means that the number of bits required to store the metadata is less than or equal to a specified requirement. Again, using the example above, if it is desired to compress 64 byte blocks to 32 bytes using a 24 byte dictionary, then the number of bytes available for metadata is 8 bytes. In this example, if the design tool determines that the required metadata is less than or equal to 8 bytes per 64 byte block, then the metadata constraint is met and the method 700 proceeds to step 712. At step 712, the design tool 202 determines that a satisfactory algorithm has been found. After this, the design tool 202 creates hardware plans for a cache using the satisfactory compression algorithm. The hardware plans include a cache compression/decompression unit 304 that compresses and decompresses data according to the satisfactory compression algorithm.

Referring back to step 710, if the metadata constraint has not been met, then the method 700 returns to step 704. If the metadata constraint has not been met but the cost is not above the threshold, then the design tool 202 applies an additional transform to the compression algorithm. The additional transform reduces the amount of metadata needed for compression by reducing the number of possible edges that may exist or by coalescing edges. As discussed above, the additional transform also either increases the cost or keeps the cost constant. In effect, looping via steps 706 and 710 serves to find a "satisfactory" algorithm that meets metadata constraints and has a cost less than a threshold by evaluating different compression algorithms defined by different combinations of transforms.

In some implementations, the method 700 is applied for each of a set of different cost thresholds. In other words, the cost threshold is varied until a satisfactory algorithm is found. In some implementations, the method 700 does not end when a single satisfactory algorithm is found (e.g., step 712 does not end the method 700). Instead, the method 700 searches through all possible combinations of transforms to identify a compression algorithm with the lowest cost.

In some implementations, step 708 performs another check in addition to the check of whether the amount of metadata is below a metadata constraint. Specifically, in some implementations, decompression is accomplished using a multiplexer for each byte of a set of output bytes of a block to be decompressed. This multiplexer selects between different bytes of the dictionary based on a selector input that is derived from the stored byte placement metadata 406. The propagation delay for a multiplexer is based on the number of possible inputs that can be selected. Thus in some implementations, step 708 also checks whether the number of possible dictionary bytes for each output byte is below a threshold. This check ensures that the propagation delay across the multiplexer for each output byte is below a threshold, which allows the cache to meet timing requirements. In some implementations, step 708 preforms a further check in addition to the check of whether the amount of metadata is below a metadata constrain. The check is for the maximum number of bits in the metadata that must be processed together (i.e., bits whose meaning depends on each other). This check limits the complexity of the metadata processing logic. The maximum number of bits is found by a process that, given a compression algorithm, breaks the metadata into groups of bits that can be processed independently.

Figure 8:
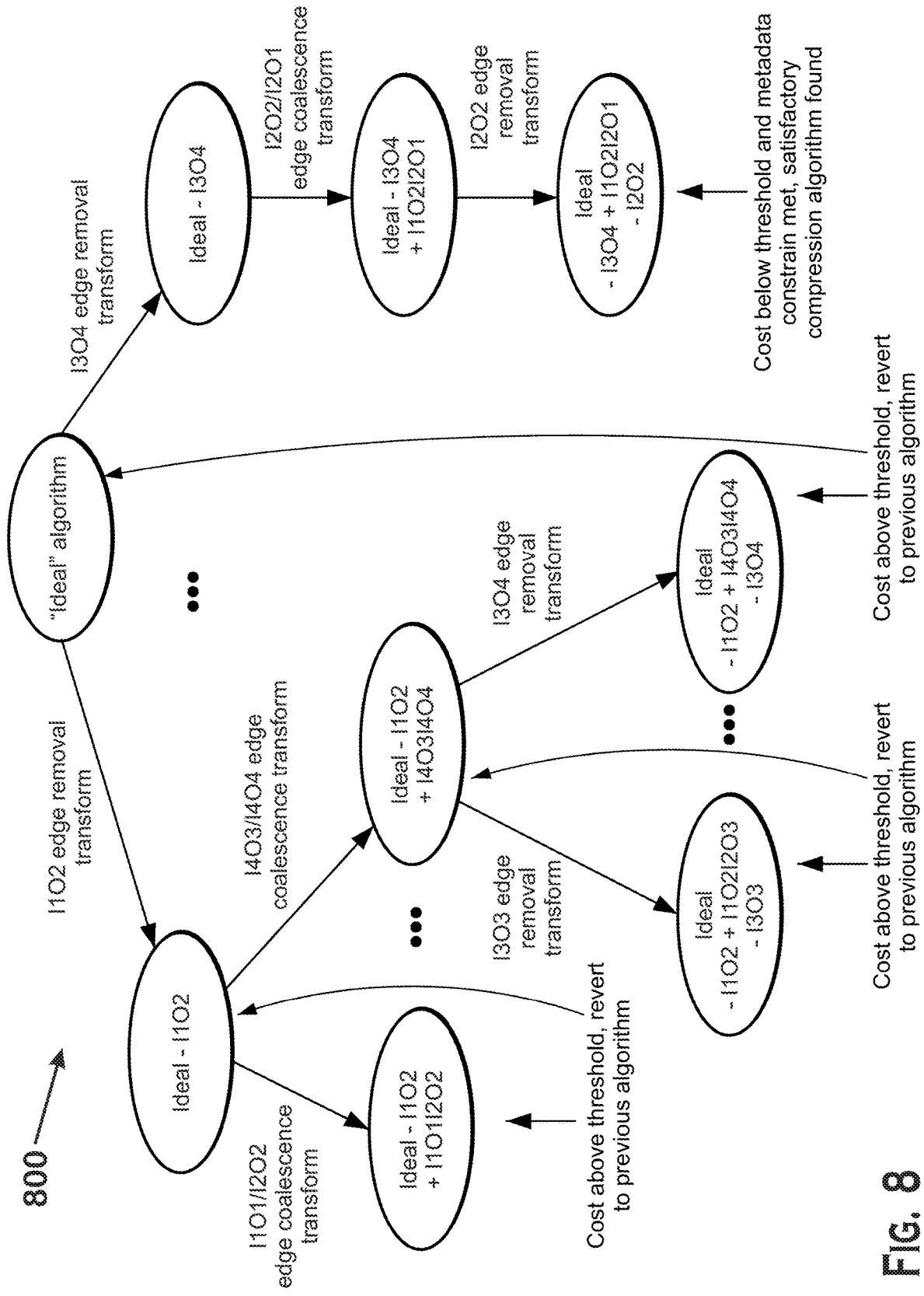
FIG. 8 is a diagram that illustrates an example of the method of FIG. 7 being applied to a particular example trace of data.

FIG. 8 is a diagram that illustrates an example of the method 700 of FIG. 7 being applied to a particular example trace. The method 700 receives a trace (step 702) and starts with the ideal algorithm. The method 700 applies a transform (edge removal of the I1O2 edge, step 704) to arrive at the compression algorithm "Ideal—I1O2" (the ideal algorithm with the edge I1O2 removed). The method 700 determines that this algorithm has a cost that is less than the threshold ("no" branch of step 706) but does not meet the metadata constraint ("no" branch of step 710) and thus applies another transform (step 704). This transform is a transform to coalesce edges I1O1and I2O2. The method 700 determines that the resulting compression algorithm has a cost above a threshold and thus reverts to a previous compression algorithm, which is the "Ideal—I1O2" algorithm. The method 700 applies more transforms to that algorithm but determines that the branches for those transforms each have a cost higher than a threshold. Some of the transforms tried are illustrated (for example, the I4O3/I4O4 edge coalescence transform, the I3O3 edge removal transform, and the I3O4 edge removal transform). An ellipsis indicates that some of the transforms tried are not illustrated in FIG. 8 for conciseness. For instance, the design tool 202 tries many transforms that branch from the "ideal—I1O2" compression algorithm, but determines that algorithms that result from those transforms have a cost higher than the threshold. Eventually, the design tool 202 finds an algorithm that both has a cost lower than the threshold and meets the metadata constraint, shown on the right side of the figure as the compression algorithm described as the idea algorithm with edges I3O4 and I2O2 removed and with edges I1O2 and I2O1 coalesced. As can be seen, the method 700 tries different combinations of transforms to arrive at one that both meets the metadata constraint and has a cost below a threshold.

In one implementation, the "search" implemented in FIG. 7 is a depth-first search. The design tool 202 keeps applying transforms to an algorithm until either both conditions (metadata constraint and cost condition) are met or until the cost is above the threshold and then reverts back to a compression algorithm for which more transforms are available to try. In an example, the algorithm that is reverted to is the most recent algorithm in a chain of transforms for which more transforms that have not yet been tried exist. In the example of FIG. 8, once the design tool 202 determines that the compression algorithm ideal—I1O2+I1O1I2O2 has a cost above the threshold, the design tool 202 reverts to Ideal—I1O2, which is the most recently tried algorithm for which transforms have not yet been tried. Once the design tool 202 determines that ideal—I1O2+I4O3I4O4−I3O4 has a cost above the threshold, the design tool 202 reverts to the ideal algorithm because it has been determined that all branches from ideal—I1O2 have costs above the threshold. After reverting to the ideal algorithm, the design tool 202 tries a different transform to the ideal algorithm than ideal—I1O2. The search is "depth first" because the search applies successive transforms before reverting to older transforms if none of successive transforms are successful.

In some implementations, every compression algorithm has an implicit zero possibility. The role of the implicit zero is to eliminate the need to explicitly store the value zero, which is very common, in the dictionary. In this situation, a zero byte is represented implicitly, in the metadata. In other words, in addition to being able to specify which byte in the dictionary to assign to any particular output byte location, the metadata also specifies whether any particular output byte location is to be assigned a zero value. In alternate implementations, a different implicit value, or more than one implicit value, may be included in the compression algorithm. For instance, in some Java runtime systems, it is common for unallocated or uninitialized memory space to include the hex values 0xDEADBEEF.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method, comprising:
   identifying an initial compression algorithm for evaluation;
   performing a transform on the initial compression algorithm to generate a modified compression algorithm;
   evaluating the modified compression algorithm for suitability based on a set of suitability criteria; and
   repeating the performing and evaluating steps to adjust the modified compression algorithm until the modified compression algorithm is deemed to meet suitability criteria,
   wherein the compression algorithm and the modified compression algorithm comprise byte-select algorithms.

2. The method of claim 1, wherein the byte select algorithms include metadata that determines how decompression occurs by identifying where bytes of a dictionary in a compressed block are to be located in an uncompressed output block.

3. The method of claim 1, wherein the transform comprises one of edge removal and edge coalescence.

4. The method of claim 3, wherein edge removal reduces the possibilities available for storage by metadata of the byte-select algorithms by removing the possibility that the metadata is able to indicate that a specific byte in an input block has an identical value to a specific byte in an output block.

5. The method of claim 3, wherein edge coalescence reduces the possibilities available for storage by metadata of the byte-select algorithms by removing the possibility that the metadata is able to independently indicate that a first byte of an input block has the same value as a first byte of an output block and that a second byte of the input block has the same value as a second byte of the output block.

6. The method of claim 1, wherein the suitability criteria comprises:
   the modified compression algorithm having a cost that is lower than a threshold.

7. The method of claim 6, wherein the cost indicates a number of additional data blocks that cannot be compressed as compared with the initial compression algorithm.

8. The method of claim 1, wherein the suitability criteria comprises:
   the modified compression algorithm meeting a metadata constraint.

9. The method of claim 1, wherein repeating the performing and evaluating steps comprises performing a depth-first search through a graph of graphs representing different compression algorithms.

10. A non-transitory computer-readable medium storing instructions that, when executed by a processor, cause the processor to:
   identify an initial compression algorithm for evaluation;
   perform a transform on the initial compression algorithm to generate a modified compression algorithm;
   evaluate the modified compression algorithm for suitability based on a set of suitability criteria; and repeat the performing and evaluating steps to adjust the modified compression algorithm until the modified compression algorithm is deemed to meet suitability criteria, wherein the compression algorithm and the modified compression algorithm comprise byte-select algorithms.

11. The non-transitory computer-readable medium of claim 10, wherein the byte select algorithms include metadata that determines how decompression occurs by identifying where bytes of a dictionary in a compressed block are to be located in an uncompressed output block.

12. The non-transitory computer-readable medium of claim 10, wherein the transform comprises one of edge removal and edge coalescence.

13. The non-transitory computer-readable medium of claim 12, wherein edge removal reduces the possibilities available for storage by metadata of the byte-select algorithms by removing the possibility that the metadata is able to indicate that a specific byte in an input block has an identical value to a specific byte in an output block.

14. The non-transitory computer-readable medium of claim 12, wherein edge coalescence reduces the possibilities available for storage by metadata of the byte-select algorithms by removing the possibility that the metadata is able to independently indicate that a first byte of an input block has the same value as a first byte of an output block and that a second byte of the input block has the same value as a second byte of the output block.

15. The non-transitory computer-readable medium of claim 10, wherein the suitability criteria comprises:
the modified compression algorithm having a cost that is lower than a threshold.

16. The non-transitory computer-readable medium of claim 15, wherein the cost indicates a number of additional data blocks that cannot be compressed as compared with the initial compression algorithm.

17. A device comprising:
a memory storing instructions; and
a processor configured to execute the instructions to:
identify an initial compression algorithm for evaluation;
perform a transform on the initial compression algorithm to generate a modified compression algorithm;
evaluate the modified compression algorithm for suitability based on a set of suitability criteria; and
repeat the performing and evaluating steps to adjust the modified compression algorithm until the modified compression algorithm is deemed to meet suitability criteria,
wherein the compression algorithm and the modified compression algorithm comprise byte-select algorithms.

18. The device of claim 17, wherein the byte select algorithms include metadata that determines how decompression occurs by identifying where bytes of a dictionary in a compressed block are to be located in an uncompressed output block.

19. The device of claim 17, wherein the transform comprises one of edge removal and edge coalescence.

20. The device of claim 19, wherein:
edge removal reduces the possibilities available for storage by metadata of the byte-select algorithms by removing the possibility that the metadata is able to indicate that a specific byte in an input block has an identical value to a specific byte in an output block; and
edge coalescence reduces the possibilities available for storage by metadata of the byte-select algorithms by removing the possibility that the metadata is able to independently indicate that a first byte of an input block has the same value as a first byte of an output block and that a second byte of the input block has the same value as a second byte of the output block.

* * * * *